(12) United States Patent
Carney et al.

(10) Patent No.: US 7,796,377 B2
(45) Date of Patent: Sep. 14, 2010

(54) COMPUTER COMPONENT EJECTOR MECHANISM

(75) Inventors: James M. Carney, Nashua, NH (US); Brian E. Davy, Harvard, MA (US); Cosmo L. Leo, Belmont, MA (US)

(73) Assignee: Oracle America, Inc., Redwood Shore, CA (US)

( * ) Notice: Subject to any disclaimer, the term of this patent is extended or adjusted under 35 U.S.C. 154(b) by 0 days.

(21) Appl. No.: 12/330,141

(22) Filed: Dec. 8, 2008

(65) Prior Publication Data

US 2010/0142135 A1  Jun. 10, 2010

(51) Int. Cl.
*G06F 1/16* (2006.01)
(52) U.S. Cl. .................................... 361/679.02
(58) Field of Classification Search ............. 361/679.02
See application file for complete search history.

(56) References Cited

U.S. PATENT DOCUMENTS

| | | | |
|---|---|---|---|
| 5,442,513 A * | 8/1995 | Lo ..................... | 361/679.35 |
| 5,831,820 A * | 11/1998 | Huang ................... | 361/679.38 |
| 6,456,501 B1 * | 9/2002 | Rubenstein et al. ......... | 361/759 |
| 6,667,879 B2 * | 12/2003 | Salinas et al. .......... | 361/679.58 |
| 6,836,406 B2 * | 12/2004 | Weng et al. ............ | 361/679.38 |
| 6,952,342 B1 * | 10/2005 | Chen ...................... | 361/679.38 |
| 6,992,886 B2 * | 1/2006 | Salinas et al. .......... | 361/679.38 |
| 7,333,329 B2 * | 2/2008 | Lambert et al. ........ | 361/679.33 |
| 7,558,058 B2 * | 7/2009 | Hidaka .................. | 361/679.38 |
| 2002/0089821 A1 * | 7/2002 | Weng et al. ................ | 361/685 |
| 2008/0089022 A1 * | 4/2008 | Cheung et al. ............. | 361/685 |
| 2008/0212277 A1 * | 9/2008 | Aoto et al. .................. | 361/687 |
| 2009/0027848 A1 * | 1/2009 | Yang .......................... | 361/686 |

* cited by examiner

*Primary Examiner*—Lisa Lea-Edmonds
(74) *Attorney, Agent, or Firm*—Brooks Kushman P.C.

(57) ABSTRACT

An ejector mechanism for removing a computer component from a computer housing is disclosed. The computer component may be an energy storage module that includes a first electrical connector that connects the energy storage module to a second electrical connector on a back plane printed circuit board. The ejector assembly is actuated at a location remote from the energy storage module to engage the energy storage module. The ejector assembly partially ejects the module from the housing and disconnects first and second electrical connector parts.

11 Claims, 5 Drawing Sheets

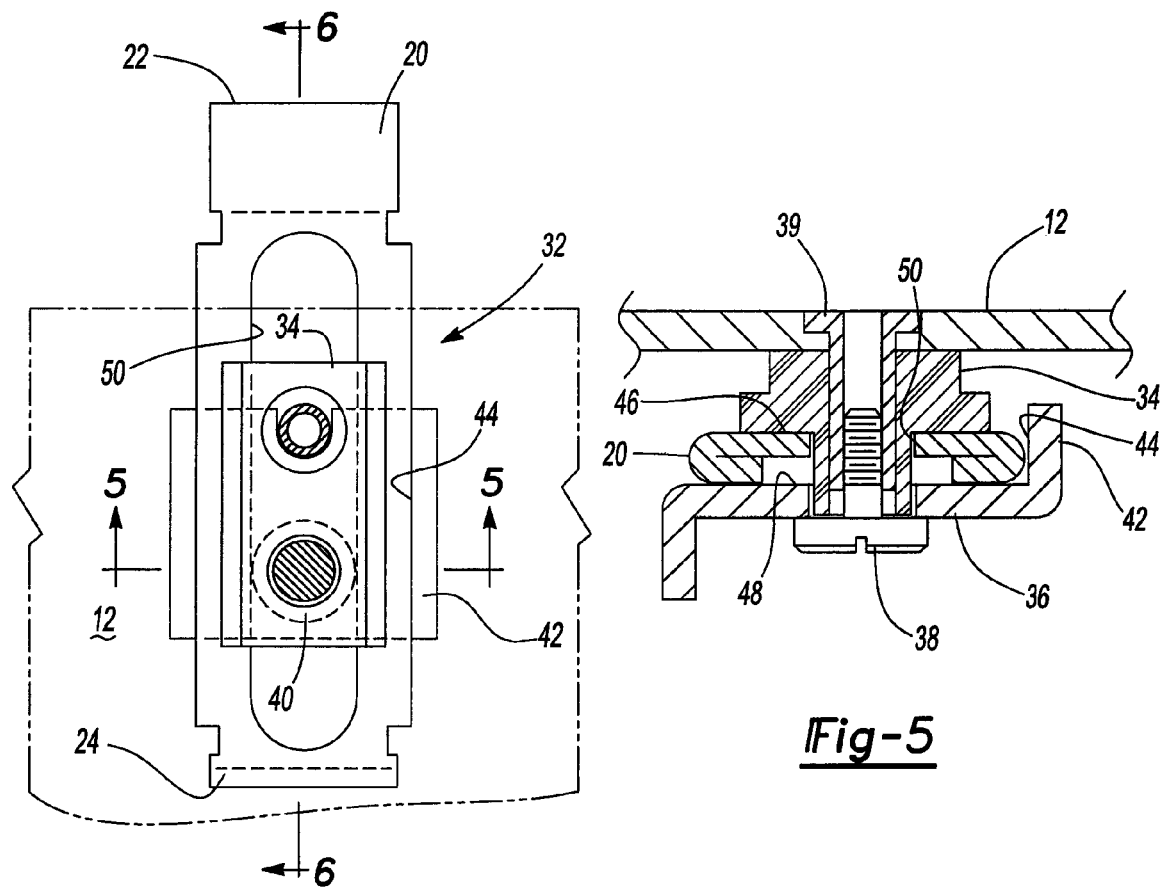
*Fig-4*
*Fig-5*
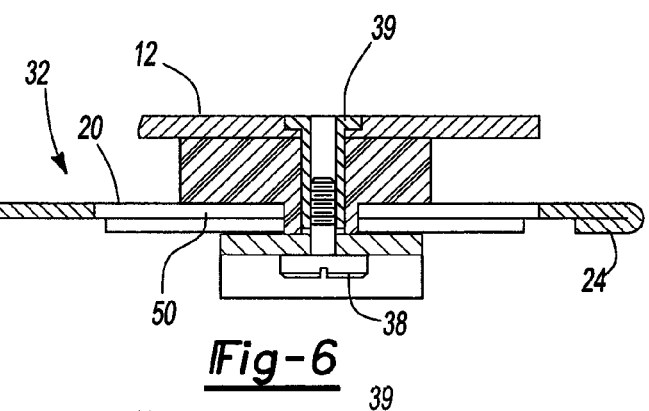
*Fig-6*
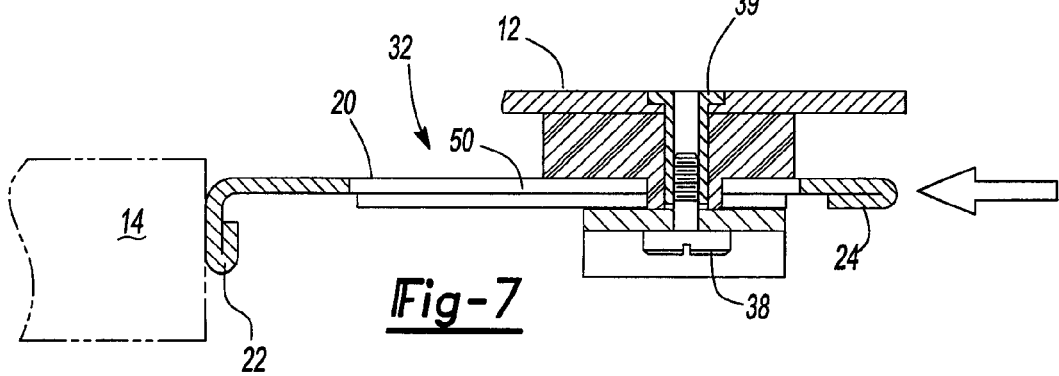
*Fig-7*

COMPUTER COMPONENT EJECTOR MECHANISM

BACKGROUND OF THE INVENTION

1. Field of the Invention

The present invention relates to a computer hardware service tool that is incorporated in a computer cabinet.

2. Background Art

Computer components are generally housed in cabinets. Cabinets permit a greater control of the environment of internal components housed in the cabinet. Cabinets also protect computer systems during use and transportation. Cabinets for computer components may be fully enclosed, partially enclosed, or open racks.

Cabinets tend to limit access to the internal components housed within and may interfere with or complicate service operations. Replacement of some components in some instances may be the preferred service operation. Some components may be removed from a computer system without interrupting operation of the computer system. The ability to service a computer without interruption is referred to as "hot swapping" and represents a substantial advantage over computers that require turning off the computer before servicing.

The present invention is directed to overcoming the above problems and limitations as summarized below.

SUMMARY OF THE INVENTION

According to one aspect of the disclosed embodiment, a simple and effective integral tool is provided for removing replaceable computer components from their associated cabinet. The tool may be an assembly that is attached to the cabinet. The assembly has a simple, but robust, design.

The assembly assists in removal of one of several closely spaced components that are internally connected to a circuit board. Connectors for connecting components to a circuit board generally should be secure to be reliable. Spring-biased contacts of connectors may require substantial insertion and removal force. Consequently, a removal tool generally should allow for application of sufficient force to permit removal of the component from the circuit board. Another important parameter for such a tool is that it generally should be convenient and easy to use. As a result, human factors and ergonomic requirements generally should be met by the mechanism.

The above aspects and other aspects of the disclosed embodiment will be better understood in view of the attached drawings and in light of the following detailed description of the illustrated embodiment.

BRIEF DESCRIPTION OF THE DRAWINGS

FIG. 4 is a plan view of the ejector mechanism;

FIG. 5 is a cross-sectional view taken along the line 5-5 in FIG. 4;

FIG. 6 is a side elevation view showing the ejector in a first, or original, position;

FIG. 7 is a side elevation view showing the ejector in a second, or ejection, position as an energy storage module is ejected from the housing;

DETAILED DESCRIPTION OF THE PREFERRED EMBODIMENT(S)

Figure 1:
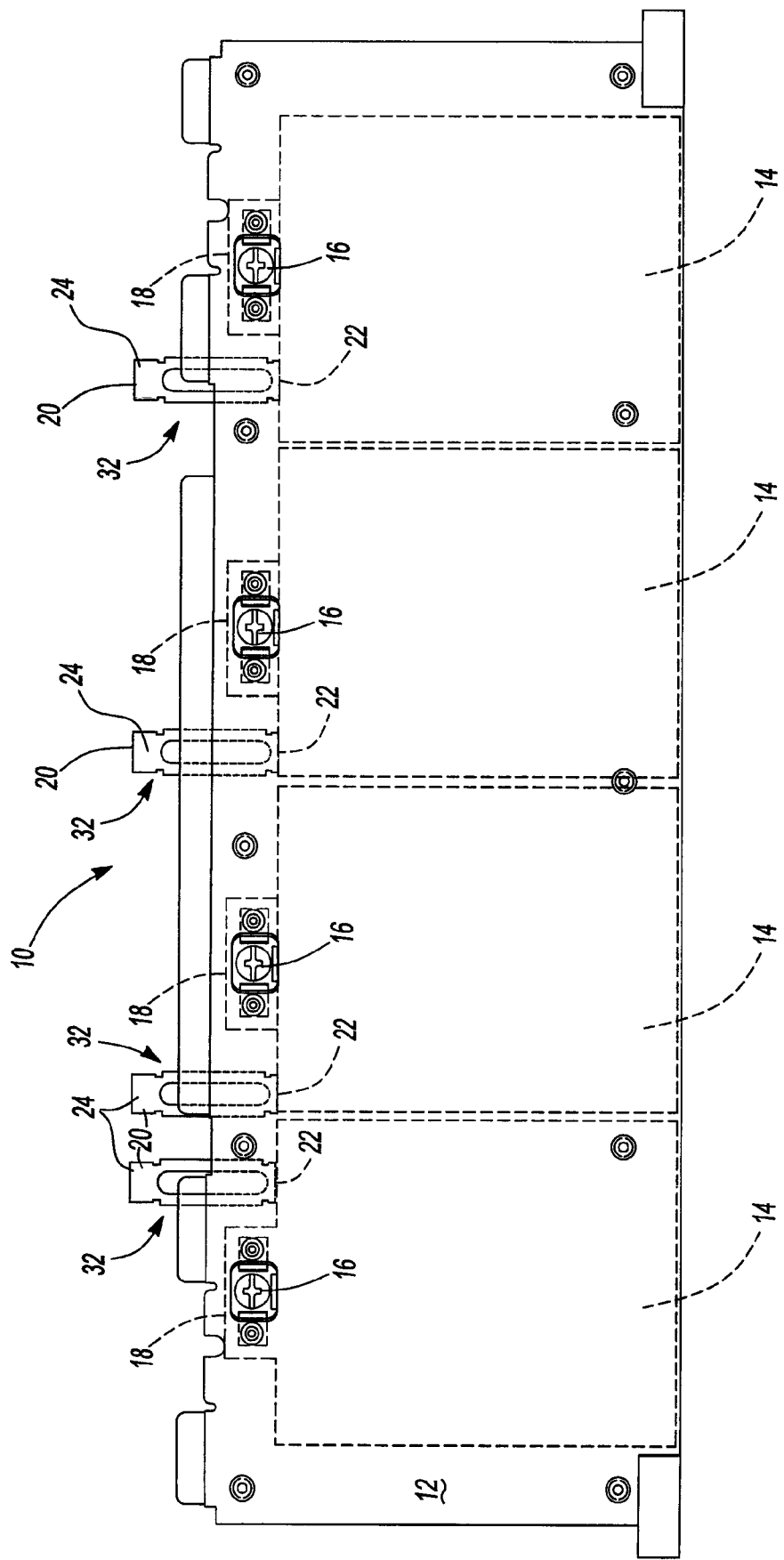
FIG. 1 is a top plan view of a server that houses a plurality of energy storage modules that may be manually ejected with an ejector mechanism made in accordance with the present invention.

Referring to FIG. 1, a server 10 is illustrated that includes a housing 12, or chassis, that encloses a plurality of energy storage modules 14. The energy storage modules 14 are retained in the housing 12 by a spring loaded captive screw assembly 16 that retains a lock flange 18. The lock flange 18 is provided on the energy storage module 14. An ejector 20 is an elongated rigid member that is used to manually eject the energy storage module 14 from the housing 12. The ejector 20 has a first portion that comprises a reversely turned flange that engages the energy storage module 14 to facilitate removing the energy storage module 14 from the housing 12. The ejector 20 has a second portion 24 that comprises a vertically extending finger grip flange. The second portion is manually engaged to slide the energy storage module 14 from the housing 12.

Energy storage modules 14 are connected to a printed circuit board 26 that is fixedly assembled to the housing 12. The printed circuit board 26 may also be referred to as a back plane printed circuit board. The back plane printed circuit board extends vertically behind the energy storage modules 14. The printed circuit board 26 includes a first connector part 28 that may be a plug or prong that extends forwardly relative to the back plane printed circuit board 26. A second connector part 30, which may be a receptacle, is provided on the energy storage module 14 in alignment with the first connector part 28. Alternatively, the receptacle could be provided on the printed circuit board 26 and the plug or prongs would be on the energy storage module 14. The energy storage module is connected to the back plane printed circuit board 26 by the first and second connector parts 28, 30.

Figure 2:
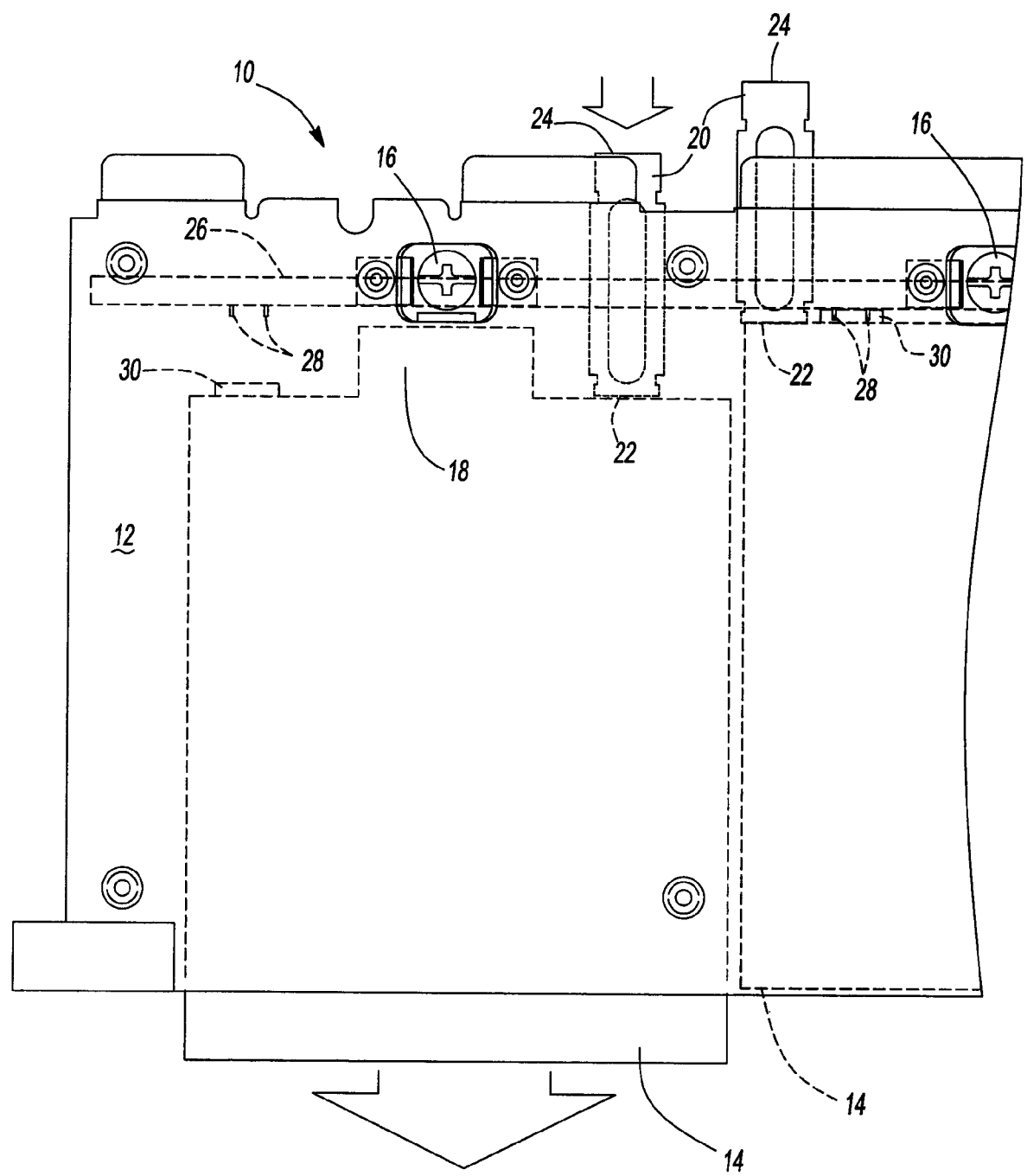
FIG. 2 is a fragmentary top plan view showing the ejector apparatus being used to eject one of the energy storage modules.

Referring to FIG. 2, the housing 12 is shown with one energy storage module 14, on the left side of the figure, being pushed forward relative to the housing 12 by the ejector 20. FIG. 2 also shows an energy storage module 14, on the right side of the figure, connected to the printed circuit board 26 by means of the first and second connector parts 28 and 30. The spring loaded captive screw assembly 16 is unscrewed to allow the energy storage module 14 to be disconnected by the ejector 20. Pressure is applied to the ejector 20 in the direction indicated by the arrow adjacent the ejector 20. The energy storage module 14 is moved in the direction shown by the larger arrow at the bottom of FIG. 2. At this point, the front of the energy storage module 14 may be grasped by a service technician and removed from the housing 12.

Figure 3:
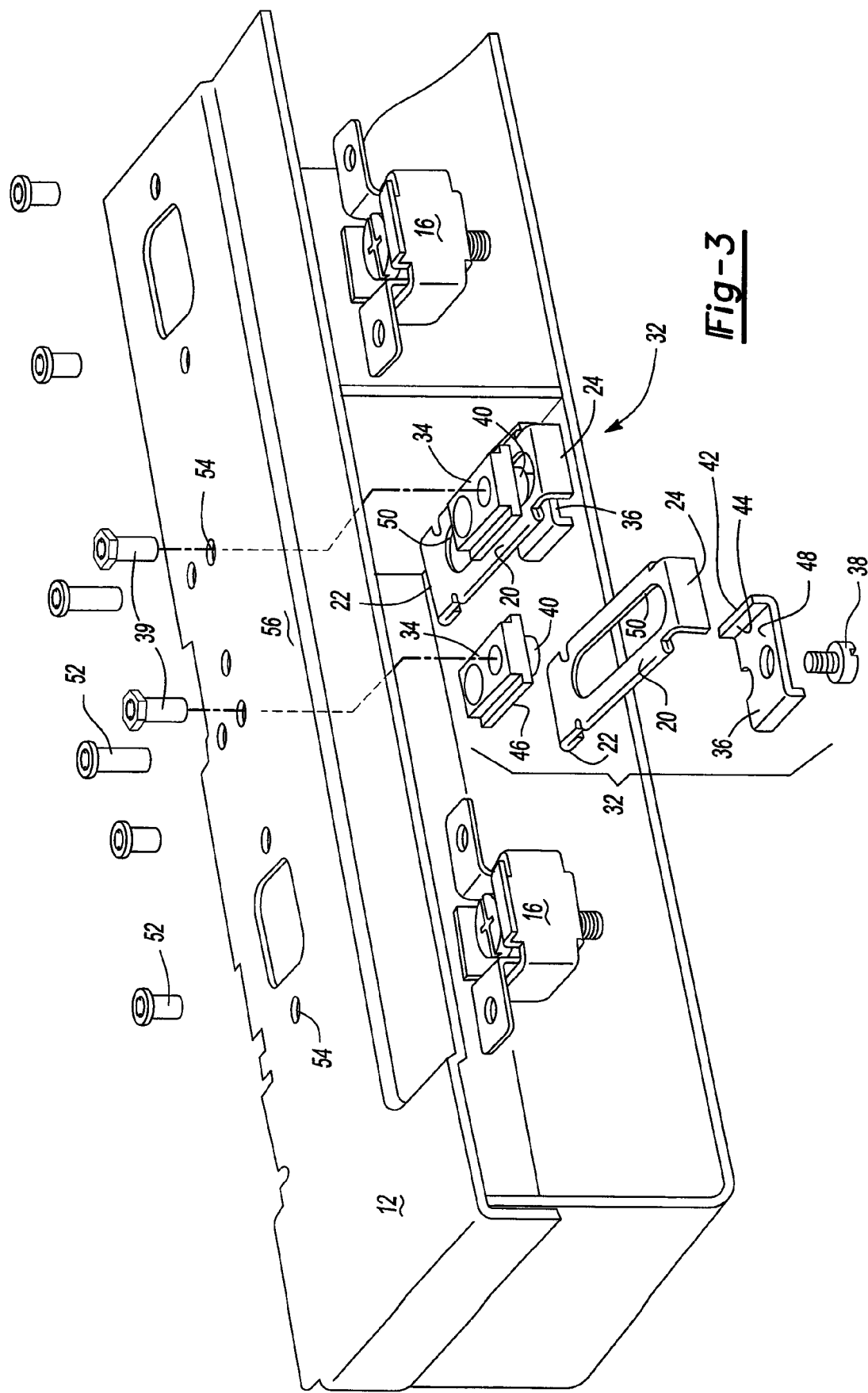
FIG. 3 is an exploded perspective view showing the housing for the server with the ejector mechanism and a locking screw assembly.

Referring to FIG. 3, an ejector assembly 32 is shown in greater detail. The ejector assembly includes the ejector 20, a first guide member 34 and a second guide member 36. The guide members 34 and 36 and ejector 20 are assembled together by a bolt 38 and a tubular nut 39 to the housing 12. One or more protrusions 40 are provided on the first guide member 34. A guide flange 42 is provided on the second guide member 36. The guide flange 42 defines a linear guide edge 44 on one side. The ejector 20 is linearly guided by the protrusion 40 and the linear guide edge 44 as it is moved between its original position shown in FIG. 1 and the ejection position shown in conjunction with the left-most energy storage module 14 as shown in FIG. 2.

The first and second guide members 34 and 36 are preferably polymeric members. A first smooth surface 46 is provided on a first guide member 34. A second smooth surface 48 is provided on the second guide member 36. The smooth surfaces 46 and 48 reduce friction as the ejector 20 is moved between its original position and the ejection position. An elongated slot 50 is provided in the ejector 20 that receives the protrusion 40, or guide feature, of the first guide member 34.

A plurality of fasteners 52, such as rivets, are received in holes 54 formed in the top wall 56 of the housing 12. The fasteners 52 are used to secure the spring loaded captive screw assembly 16 and the ejector assembly 32 to the top wall 56 of the housing 12.

Referring to FIG. 4, the ejector assembly 32 is shown assembled to the housing 12. The second portion 24 of the ejector 20 extends rearwardly from the housing 12 and the first portion 22 is positioned within the housing adjacent to the energy storage module 14 (not shown in FIG. 4). The elongated slot 50 in the ejector 20 is constrained by the protrusion 40 and the linear guide edge 44 of the guide flange 42 that together guide the ejector 22 in a motion that is limited to a reciprocal linear motion.

Referring to FIG. 5, the ejector assembly 32 is shown in cross-section to illustrate how the bolt 38 and tubular nut 39 secure the first and second guide members 34 and 36 on opposite sides of ejector 20. The ejector 20 slides against the first smooth surface 46 on the first guide member 34 and on the second smooth surface 48 of the second guide member 36. The cylindrical protrusion 40 is received in the slot 50 defined in the ejector 20. The linear guide edge 44 of the guide flange 42 engages one side of the ejector 20.

Referring to FIG. 6, the ejector 20 is shown in its original position with the energy storage module 14 fully installed in the housing 12. The first portion 22 of the ejector is in contact with the energy storage module 14.

Referring to FIG. 7, the ejector 20 is shown in its ejection position with the energy storage module 14 partially ejected from the housing 12.

Figure 8:
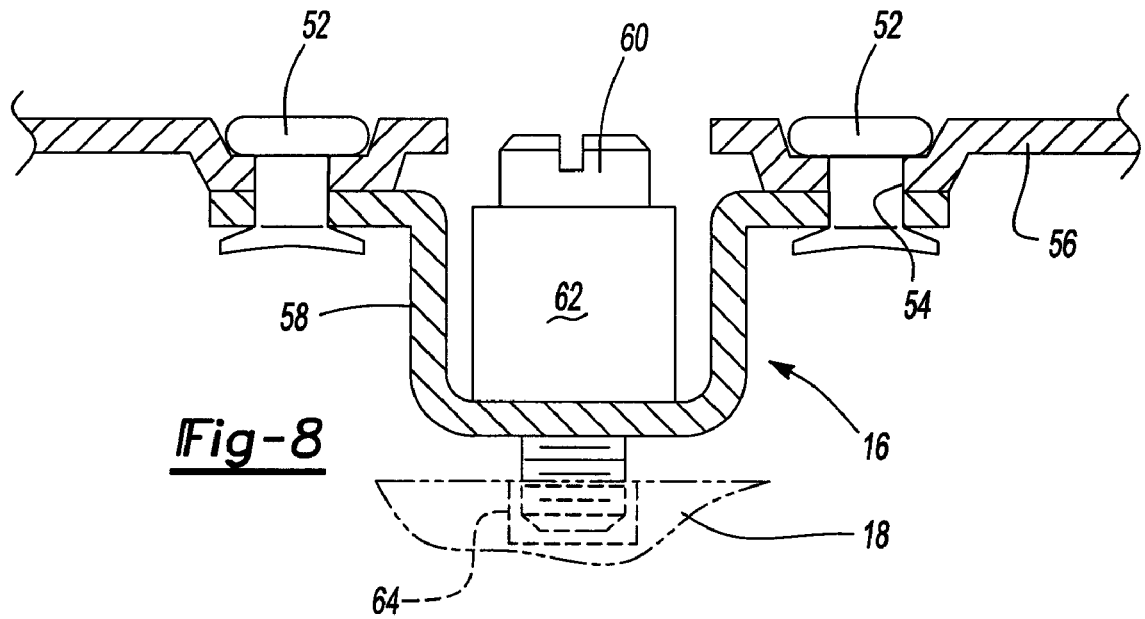
FIG. 8 is a fragmentary cross-sectional view of the locking screw assembly shown engaging a lock flange to lock the energy storage module in place.
Figure 9:
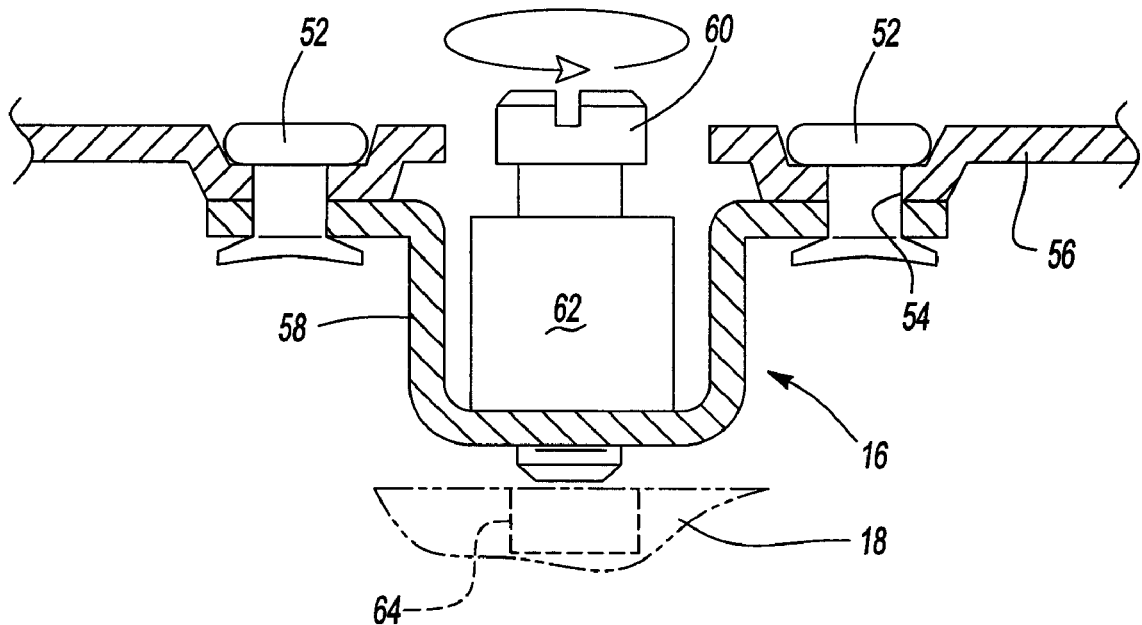
FIG. 9 is a view similar to FIG. 8 showing the locking screw assembly with the lock flange of the energy storage module released to allow ejection of the energy storage module.

Referring to FIGS. 8 and 9, the spring loaded captive screw assembly 16 is shown in a locked position in FIG. 8 and an unlocked position in FIG. 9. The spring loaded captive screw assembly 16 includes a bracket 58 that is secured to the top wall 56 by a plurality of rivets 52. A locking screw 60 is accessible from above the top wall 56 and may be received in a nut 64 that is pressed into the lock flange 18 that locks the energy storage module 14 in the housing 12. The locking screw 60 is biased by a spring (not shown) contained with a spring housing 62. The screw 60 is biased to prevent the screw 60 from contacting the flange 18 as the energy storage module 14 is moved in and out of the housing 12.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A cabinet for a computer system comprising:
    a housing;
    a selectively removable module in the housing;
    a first electrical connector secured to the module;
    a second electrical connector secured within the housing; and
    an ejector assembly including an ejector having a first portion that engages the module and a second portion that is actuated at a location that is remote from the module to disengage the module and separate the first and second connectors, wherein the ejector comprises an elongate rigid member that is secured to the housing to reciprocally slide relative to the housing and disconnect the first and second electrical connectors, and wherein first and second guide members sandwich the ejector.

2. The cabinet for a computer system of claim 1 wherein one of the guide members has a guide flange that defines a linear guide edge.

3. The cabinet for a computer system of claim 1 wherein first and second guide members each have a smooth surface that engage opposite sides of the ejector as the ejector is shifted when the ejector assembly is used to eject the module and separate the first and second connectors.

4. The cabinet for a computer system of claim 1 wherein the ejector defines an elongated slot that extends lengthwise in the ejector and that receives a guide feature of one of the guide members.

5. The cabinet for a computer system of claim 1 wherein the second connector is attached to a printed circuit board that is assembled within the housing.

6. A cabinet for a computer system comprising: a housing; a selectively removable module in the housing; a first electrical connector secured to the module; a second electrical connector secured within the housing; and an ejector having a first portion that engages the module and a second portion that is actuated at a location that is remote from the module to disengage the module and separate the first and second connectors; and a handle on the second portion of the ejector that is used to manually actuate the ejector assembly.

7. A server comprising:
    a housing;
    a first electrical connector part fixedly secured to the housing;
    an energy storage module in the housing and having a second electrical connector part that is received by the first electrical connector part; and
    an ejector assembly having a first portion that engages the energy storage module and a second portion that has a manually operated actuator at a location that is remote from the energy storage module for disengaging the first and second electrical connectors and sliding the energy storage module from the housing, an elongate rigid slide that is secured to the housing to slide relative to the receptacle, and wherein first and second guide members sandwich the slide.

8. The server of claim 7 wherein one of the guide members has a flange that defines a linear guide edge.

9. The server of claim 7 wherein the guide members have facing smooth surfaces that engage opposite sides of the slide that facilitate the sliding movement of the slide as the ejector assembly is used to separate the energy storage module from the housing.

10. The server of claim 7 wherein the slide defines an elongated slot that extends lengthwise in the slide and receives a protrusion of one of the guide members.

11. The server of claim 7 wherein the first electrical connector part is attached to a printed circuit board that is attached to the housing.

* * * * *